United States Patent
Kuznetsov (10) Patent No.: US 9,978,885 B1
(45) Date of Patent: May 22, 2018

(54) THERMO-COMPENSATED SILICON PHOTO-MULTIPLIER WITH ON-CHIP THERMISTOR

(71) Applicant: Evgeny N. Kuznetsov, Huntsville, AL (US)

(72) Inventor: Evgeny N. Kuznetsov, Huntsville, AL (US)

(73) Assignee: Board of Trustees of the University of Alabama, for and on behalf of the University of Alabama in Huntsville, Huntsville, AL (US)

( * ) Notice: Subject to any disclaimer, the term of this patent is extended or adjusted under 35 U.S.C. 154(b) by 0 days. days.

(21) Appl. No.: 15/227,500

(22) Filed: Aug. 3, 2016

Related U.S. Application Data (60) Provisional application No. 62/276,502, filed on Jan. 8, 2016.

(51) Int. Cl.
| | | |
|---|---|---|
| *G01T 1/24* | (2006.01) | |
| *H01L 31/02* | (2006.01) | |
| *H01L 27/146* | (2006.01) | |
| *G01J 1/44* | (2006.01) | |

(52) U.S. Cl.
CPC .......... *H01L 31/02027* (2013.01); *G01J 1/44* (2013.01); *H01L 27/14634* (2013.01); *H01L 27/14643* (2013.01); *G01J 2001/444* (2013.01); *G01J 2001/448* (2013.01); *G01J 2001/4466* (2013.01)

(58) Field of Classification Search
CPC .......................... G01T 1/1644; G01T 1/2018
See application file for complete search history.

(56) References Cited

PUBLICATIONS

Licciulli et al., "An active compensation system for the temperature dependence of SiPM gain," Feb. 2015, IEEE Transaction on Nuclear Science, vol. 62, No. 1, pp. 228-235.*

Baszczy et al., "Compensation of the temperature flucations in the silicon photomultiplier measurement system," May 24-26, 2012, Warsaw, Poland, 19th International Conference "Mixed Design of Integrated Circuits and Systems", pp. 300-303.*

Piemonte et al., "Characterization of the first prototypes of silicon photomultiplier fabricated at ITC-irst," Feb. 2007, IEEE Transactions on Nuclear Science, vol. 54, No. 1, pp. 236-244.*

Shukla, et al, "A Survey of Power Supply Techniques for Silicon Photo-Multiplier Biasing," International Journal of Engineering Research and General Science, vol. 2, Issue 4, Jun.-Jul. 2014, ISSN 2091-2730.

(Continued)

*Primary Examiner* — Kiho Kim
(74) *Attorney, Agent, or Firm* — Maynard Cooper & Gale, P.C.; Jon E. Holland (57) ABSTRACT

A silicon photomultiplier (SiPM) device is provided with a SiPM matrix fabricated on a substrate, a bias power supply connected to the SiPM matrix, and a compensation circuit coupled to the bias power supply. The bias power supply provides a bias voltage to the SiPM matrix. The compensation circuit can adjust the bias voltage applied to the SiPM matrix in response to temperature changes at the substrate. The compensation circuit includes a resistor fabricated on the substrate with the SiPM matrix. The resistor can have a resistance that varies in response to temperature changes at the substrate.

22 Claims, 5 Drawing Sheets

(56) References Cited

PUBLICATIONS

Anderson, et al., "Upgrade of the CMS Hadron Outer Calorimeter with SIPMS," Elsevier Physics Procedia, vol. 37, pp. 72-78, 2012.

Li, et al, "A Gain Control and Stabilization Technique for Silicon Photomultipliers in Low-Light-Level Applications around Room Temperature," Institute of High Energy Physics, vol. 695, pp. 222, 2012.

Licciulli, et al, "A Novel Technique for the Stabilization of SiPM Gain Against Temperature Variations," IEEE Transactions on Nuclear Science, vol. 60, No. 2, pp. 606-611, Apr. 2013.

Ramilli, Marco, "Characterization of SiPM: temperature dependecies," IEEE Nuclear Science Symposium Conference Record, pp. 2467-2470, 2008.

Eminoglu, et al., "Low-cost uncooled infrared detectors in CMOS process," Sensors and Actuators A, vol. 109, pp. 102-113, 2003.

Petasecca, et al., "Thermal and Electrical Characterization of Silicon Photomultiplier," IEEE Transactions on Nuclear Science, vol. 55, No. 3, pp. 1686-1690, Jun. 2008.

Otte, et al., "Prospects of Using Silicon Photomultipliers for the Astroparticle Physics Experiments EUSO and MAGIC," IEEE Transactions on Nuclear Science, vol. 53, No. 2, pp. 636-640, Apr. 2006.

Lightfoot, et al., "Characterisation of a Silicon Photomultiplier Device for Applications in Liquid Argon Based Neutrino Physics and Dark Matter Searches," http://arxiv.org/abs/807.3220.DO:10.1088/1748-0221/3/10/P1001, Jul. 2008.

\* cited by examiner

THERMO-COMPENSATED SILICON PHOTO-MULTIPLIER WITH ON-CHIP THERMISTOR

CROSS-REFERENCE TO RELATED APPLICATIONS

This application claims the benefit of U.S. Provisional Application No. 62/276,502, entitled "Thermo-Compensated Silicon Photo-Multiplier with On-Chip Thermistor," and filed Jan. 8, 2016, which application is hereby incorporated by reference in its entirety.

BACKGROUND

The present application generally relates to a thermo-compensated silicon photo-multiplier with an on-chip thermistor.

A silicon photo-multiplier (SiPM) is a solid state detector with a matrix of avalanche photodiodes operated in a Geiger mode. SiPMs have been actively used in new photodetectors due to their excellent characteristics for detection of low intensities of light. The SiPMs can be used in physics experiments, aerospace applications and medical applications due to their compact size, good single photon counting resolution, high photon detection efficiency (e.g., up to 60%), high gain (e.g., up to $10^6$), and insensitivity to magnetic fields. However, a limitation of SiPMs is that several important characteristics of the SiPM, such as gain, noise and photon detection efficiency, have a significant temperature dependence.

There are several approaches that can be used to design systems to mitigate the temperature dependence in SiPMs. For example, thermo-compensating systems can use temperature control, control of SiPM dark current and/or control of the SiPM bias voltage with respect of temperature in order to reduce the temperature dependence in SiPMs. The current thermo-compensating systems generally require additional resources, increase total power consumption and are not optimal for photodetectors that have many SiPM chips with different parameters such as breakdown voltage, leakage current and gain.

SUMMARY

The present application generally pertains to a device with a silicon photo-multiplier (SiPM) matrix and a thermo-compensating resistor manufactured on the same chip using standard CMOS technology. The thermo-compensating resistor can be either an N-well or P-well on-chip resistor and can be chosen to have a temperature dependence coefficient higher than the temperature dependence of the SiPM matrix breakdown voltage by a factor of about 1.5 to about 10. Both terminals of the thermo-compensating resistor are routed to outer pins of the chip. In one embodiment, one terminal of the thermo-compensating resistor is connected to the SiPM matrix cathode and the other terminal is connected to ground. A bias voltage can be applied to the thermo-compensating resistor at the SiPM cathode via an external resistor (i.e., not on the chip with the thermo-compensating resistor) with a low temperature dependence coefficient, e.g., ±5 ppm/° C., resistor. The use of the external resistor forms a resistive divider for the bias voltage and serves to adjust the resulting bias voltage applied at the SiPM cathode to have a temperature dependence at about the same level as the temperature dependence of the SiPM matrix breakdown voltage. The use of the external resistor for scaling eliminates the requirement to manufacture the thermo-compensating resistor with a temperature dependence coefficient exactly matching the temperature dependence of the SiPM matrix breakdown voltage.

Since the thermo-compensating resistor is made on the same substrate as the SiPM matrix, the thermo-compensating resistor can track or sense exactly the temperature of the SiPM chip. For easier setting of the SiPM overvoltage value (the difference between the bias voltage and the breakdown voltage), a terminal of the thermo-compensating resistor can be connected to ground via another resistor with low temperature dependence. The use of a ground resistor with the thermo-compensating resistor allows the maintaining of a constant overvoltage value and therefore a stable SiPM gain and photon detection efficiency for operation at average light intensities below about 100,000 photons per second. The bias voltage can be adjusted in accordance with parameters (e.g., breakdown voltage, gain) of the given SiPM chip to provide improvement for multichannel systems, which include many SiPM chips with different parameters. In other words, the bias voltage can be individually adjusted for each SiPM chip. In another embodiment, for higher light intensities (above approximately 1 million photons per second) or a large SiPM leakage current, the thermo-compensating resistor can be connected via an additional external resistor to a stable reference voltage instead of the bias voltage supply. The voltage potential at the thermo-compensating resistor is then used to control the output voltage of the bias power supply.

One advantage of the present application is that it keeps production costs low by not requiring any changes to the technological process of SiPM manufacturing.

Another advantage of the present application is that it eliminates the need for complicated systems to stabilize SiPM gain, does not require extra power and does not increase size or cost.

A further advantage of the present application is that the thermo-compensating system does not depend on the SiPM leakage current and integral light intensity.

Other features and advantages of the present application will be apparent from the following more detailed description of the identified embodiments, taken in conjunction with the accompanying drawings which show, by way of example, the principles of the application.

BRIEF DESCRIPTION OF THE DRAWINGS

Wherever possible, the same reference numbers are used throughout the drawings to refer to the same or like parts.

DETAILED DESCRIPTION

The present disclosure is directed to a device, such as photodetector, that has a silicon photo-multiplier (SiPM) matrix and a resistor Rt manufactured on a single chip (the SiPM chip) using standard CMOS technology. The on-chip resistor Rt can be either an N-well or P-well resistor with a temperature coefficient of resistance (TCR), or temperature dependence coefficient, higher than the temperature dependence of the SiPM matrix breakdown voltage (TCU_br) by a factor of about 1.5 to about 10, although other factors are possible.

Since the on-chip resistor Rt is made on the same substrate as the SiPM matrix, the on-chip resistor can track or sense exactly the temperature of the SiPM chip. The bias voltage for the SiPM matrix can be adjusted in accordance with parameters such as the breakdown voltage or gain of the SiPM matrix on the SiPM chip. The adjustment of the bias voltage can be used in multichannel systems, which include many SiPM chips with SiPM matrices having different parameters.

Both terminals of the on-chip resistor Rt can be routed to outer pins of the SiPM chip. One of the terminals of the on-chip resistor Rt can be connected to ground via a ground resistor Rgnd for use in setting the SiPM matrix overvoltage value. The ground resistor Rgnd can be a low TCR resistor that, when used with the on-chip resistor Rt, enables the maintaining of a constant overvoltage value for the SiPM matrix and therefore a stable SiPM matrix gain and photon detection efficiency for operation at average light intensities below about 100,000 photons per second. The other terminal of the on-chip resistor Rt can be connected to a bias voltage in a first embodiment and to a stable reference voltage in a second embodiment.

In a first embodiment, the on-chip resistor Rt can be connected to the cathode of the SiPM matrix. The cathode of the SiPM matrix can then be connected to the bias voltage via a first external resistor R1ext. The first external resistor R1ext can be a low TCR resistor. The temperature dependence coefficient for the first external resistor R1ext can be approximately ±5 ppm/° C. A bias voltage can be applied to the on-chip resistor Rt at the SiPM cathode via the first external resistor R1ext. The use of the first external resistor R1ext forms a resistive divider for the bias voltage and serves to assist in providing a resulting temperature dependence to the bias voltage applied to the SiPM cathode. The temperature dependence of the bias voltage can be at the same level as the temperature dependence of the SiPM breakdown voltage. The use of the first external resistor R1ext for scaling eliminates the need for the TCR of the on-chip resistor Rt to exactly match the temperature dependence of the SiPM matrix breakdown voltage.

In a second embodiment, the on-chip resistor Rt can be connected to a stable reference voltage via a second external resistor R2ext. The second embodiment can be used for higher light intensities (above approximately 1 million photons per second) or a large SiPM leakage current. The voltage potential at the on-chip resistor Rt is then used to control the output voltage of the bias power supply.

Figure 1:
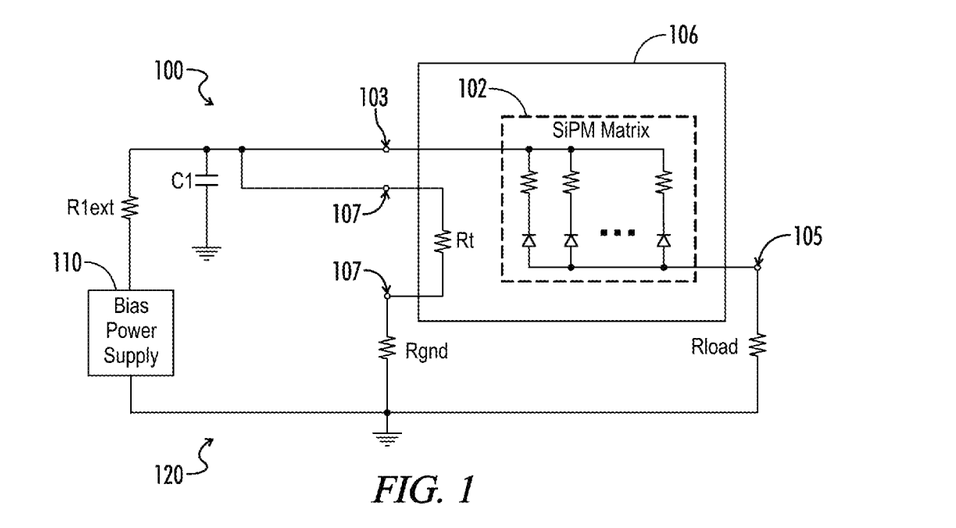
FIG. 1 is a circuit diagram of an embodiment of a device with a silicon photomultiplier (SiPM).

FIG. 1 shows an embodiment of a device 100, such as a photodetector, with a silicon photomultiplier (SiPM). The device 100 includes a SiPM matrix 102 and a resistor Rt (also referred to as a thermistor) fabricated on the same substrate 106. In one embodiment, the substrate 106 can be silicon, but other types of substrates 106 can be used in other embodiments.

There are several types of technological processes that can be used to fabricate the resistor Rt. For example, the resistor Rt can be fabricated using high TCR materials such as amorphous silicon, amorphous silicon carbide, or polycrystalline silicon-germanium with TCR values of about 2.5%/K, 4-6%/K, and 2-3%/K, respectively. In one embodiment, the resistor Rt can be fabricated as an N-well or P-well type CMOS resistor. An N-well type resistor can have a TCR in the range of about 2000 ppm/° C. to about 3000 ppm/° C. In one embodiment, TCR can be expressed as the change in resistance in ppm (0.0001%) with each degree of change in temperature Celsius (° C.). For example, if resistor Rt has a TCR of 2000 ppm/° C., the resistance of Rt can change −2% total over a 10-degree change and 20% total over a 100-degree change. The sheet resistance of an N-well resistor can be about 1 kOhm/square to about 3 kOhm/square that allows fabricating of resistors with high values of the order of about 0.1 to about 10 MOhms and of about 2000 ppm to about 3000 ppm for TCR to keep power consumption low and minimize heating of the substrate 106.

The substrate 106 can have an input connection or terminal 103 (which can also be referred to as the cathode for the SiPM matrix 102) that couples the SiPM matrix 102 and a bias power supply 110 and output connection or terminal 105 (which can also be referred to as the anode for the SiPM matrix 102) that couples the SiPM matrix 102 to an output load (represented by the resistor Rload). The SiPM matrix 102 can include an array of avalanche photodiodes (APDs) operated in Geiger-mode at a reversed bias voltage exceeding the breakdown voltage of the APDs. In one embodiment, the APDs can be operated at an overvoltage value (i.e., the difference between the bias voltage and the breakdown voltage) of between about 2 and about 5 volts (V), although other values are possible. Each of the APDs in the SiPM matrix 102 can be connected in series to corresponding quenching resistors used to reset the APDs after the detection of a single photon event.

In one embodiment, the breakdown voltage of the SiPM matrix 102 can have a temperature dependence that can vary between approximately 649 ppm/° C. to approximately 2065 ppm/° C. The gain and photon detection efficiency of the SiPM matrix 102 can be maintained substantially constant (with respect to temperature changes) if the overvoltage value for the SiPM matrix 102 is kept substantially constant. To keep the overvoltage value substantially constant, the bias voltage applied to the SiPM matrix 102 by the bias power supply 110 can have about the same temperature dependence as the breakdown voltage of the SiPM matrix 102. In other words, the bias voltage provided to the SiPM matrix 102 by the bias power supply 110 can be increased or decreased by an amount that corresponds to an increase or decrease of the breakdown voltage of the SiPM matrix 102 as a result of temperature changes to keep the overvoltage value applied to the SiPM matrix 102 relatively constant.

To provide for the adjustment of the bias voltage applied to the SiPM matrix 102 by the bias power supply 110, a compensation circuit 120 can be used to vary the bias voltage provided to input connection 103 by the the bias power supply 110. The compensation circuit 120 can include the resistor Rt on the substrate 106. The resistor Rt can have a temperature dependence coefficient that is greater than the temperature dependence coefficient of the breakdown voltage of the SiPM matrix 102. In one embodiment, the temperature dependence coefficient of resistor Rt can be greater than the temperature dependence coefficient of the breakdown voltage of the SiPM matrix 102 by a factor in the range of about 1.5 to about 10. The resistor Rt can accurately track or sense changes in the temperature of the SiPM matrix 102 since the resistor Rt and the SiPM matrix 102 are on the same substrate 106. In other words, the resistance of resistor Rt can vary based on temperature similar to how the breakdown voltage of the SiPM matrix 102 varies based on temperature. The temperature dependence of resistor Rt can be used by the compensation circuit 120 to adjust the bias voltage applied to the SiPM matrix 102 by the bias power supply 110.

The substrate 106 can have connections or terminals 107 for the resistor Rt to be connected to the compensation circuit 120. In the embodiment shown in FIG. 1, one connection 107 for the resistor Rt can be connected to the input connection 103 for the SiPM matrix 102 and the other connection for the resistor Rt can be connected to ground via a resistor Rgnd. The compensation circuit 120 can also include a resistor R1ext and a noise filtering capacitor C1 coupled to the input connection 103. In one embodiment, the resistor R1ext can be connected in series between the bias power supply 110 and the input connection 103. In another embodiment, both R1ext and Rgnd can be low TCR resistors, e.g., a TCR below about 5 ppm/° C.

The compensation circuit 120 can adjust the bias voltage provided to the input connection 103 by the bias power supply 110 through the use of a resistive divider formed by the resistor Rt, the resistor Rgnd and the resistor R1ext. The resistive divider in the compensation circuit 120 can adjust the bias voltage provided by the bias power supply 110 to match changes in the breakdown voltage of the SiPM matrix 102 as a result of changes of temperature. In other words, the voltage drop over resistors Rt and Rgnd (which corresponds to the bias voltage applied to the input connection 103 for the SiPM matrix 102) can have a temperature dependence that is similar to the temperature dependence of the breakdown voltage of the SiPM matrix 102.

Figure 2:
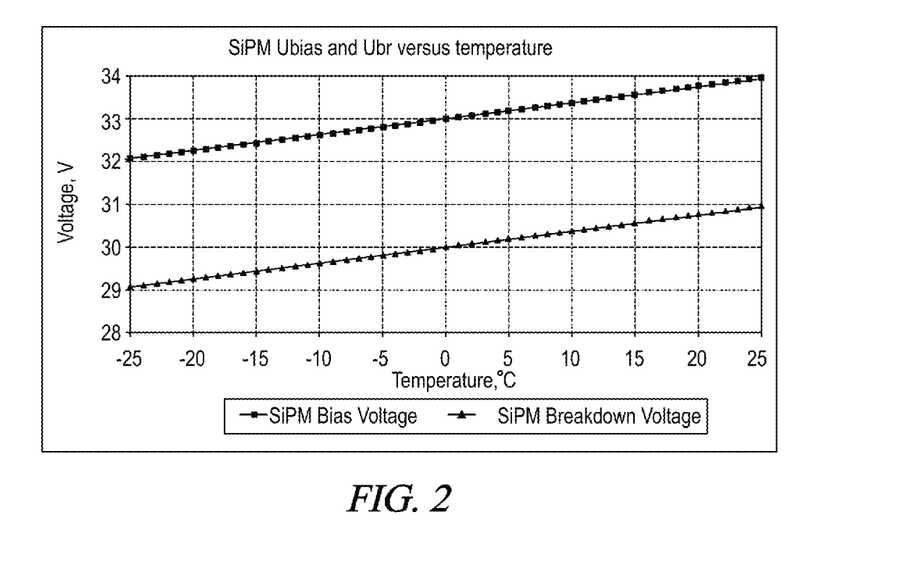
FIG. 2 is a graph showing the SiPM bias voltage and the SiPM breakdown voltage with respect to temperature.
Figure 3:
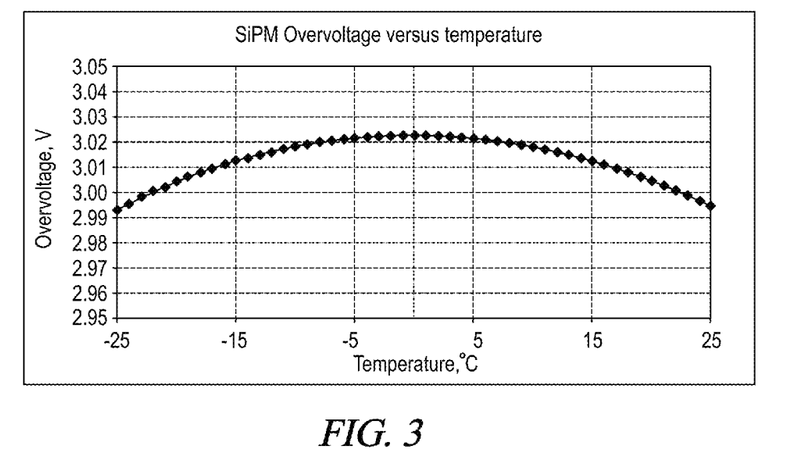
FIG. 3 is a graph showing the SiPM overvoltage (without accounting for SiPM leakage current) with respect to temperature.

FIGS. 2 and 3 show modeled results for the device of FIG. 1. The following values were used for the model: Ubr (the breakdown voltage for the SiPM matrix 102)=30 V at 0° C.; Rt (the resistance for resistor Rt)=1000 kΩ; TCR (the thermal dependence coefficient for resistor Rt)=2500 ppm/° C.; TCU_br (the thermal dependence coefficient for the breakdown voltage of the SiPM matrix 102)=1250 ppm/° C.; R1ext (the resistance for resistor R1ext)=1000 kΩ; Rgnd (the resistance for resistor Rgnd)=66 kΩ; and Ups (the output voltage of the bias power supply 110)=64V. In the model, the resistance for resistor Rgnd was chosen to achieve SiPM overvoltage value 3V. FIG. 2 shows a graph of the SiPM bias voltage (Ubias) and the SiPM matrix breakdown voltage (Ubr) with respect to temperature and without accounting for SiPM matrix leakage current. The graph of FIG. 2 shows how the temperature dependence of the SiPM bias voltage is matched to temperature dependence of the breakdown voltage. The SiPM bias voltage shown in FIG. 2 is the voltage applied to the SiPM matrix 102 at the input connection 103 (or cathode) for the SiPM matrix 102. FIG. 3 shows a graph of the SiPM overvoltage with respect to temperature and without accounting for SiPM matrix leakage current. The SiPM overvoltage is the difference between Ubias and Ubr. As shown in FIG. 3, the SiPM overvoltage change is kept within about 1% for the temperature range of about −25° C. to about +25° C. For the temperature range of about −5° C. to about +5° C., the overvoltage variations are within about 0.04%.

Figure 4:
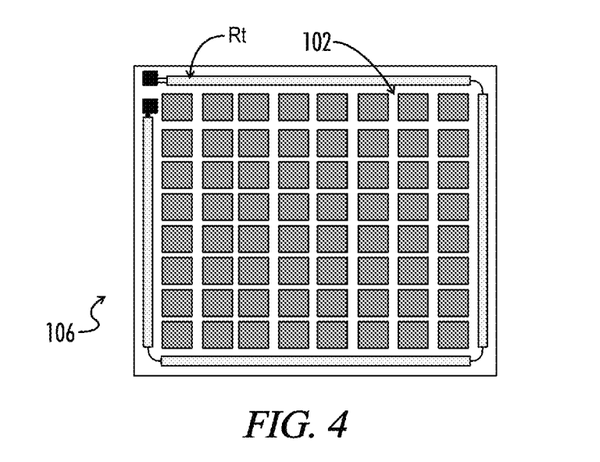
FIG. 4 shows an embodiment of the thermo-compensating resistor on the substrate of FIG. 1.

FIG. 4 shows an embodiment of the thermo-compensating resistor Rt. As shown in FIG. 4, the resistor Rt can be located on the perimeter of the substrate 106. While the embodiment of FIG. 4 shows the resistor Rt on the perimeter of all the sides of the substrate 106, the resistor Rt may be located on the perimeter of fewer than all of the sides of the substrate 106 in other embodiments. In addition, the resistor Rt can be placed on the substrate 106 to at least partially surround the SiPM matrix 102. By having the resistor Rt at least partially surround the SiPM matrix 102, the resistor Rt can more accurately sense the temperature of the SiPM matrix 102. In another embodiment, the resistor Rt can be positioned between pixels or microcells, e.g., avalanche photodiodes, of the SiPM matrix 102 to sense the temperature of the SiPM matrix 102.

Figure 5:
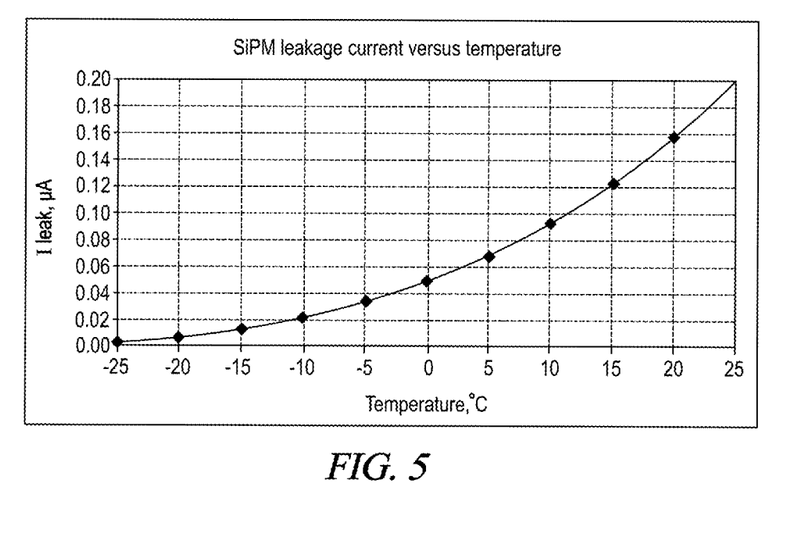
FIG. 5 is a graph of the SiPM leakage current with respect to temperature.
Figure 6:
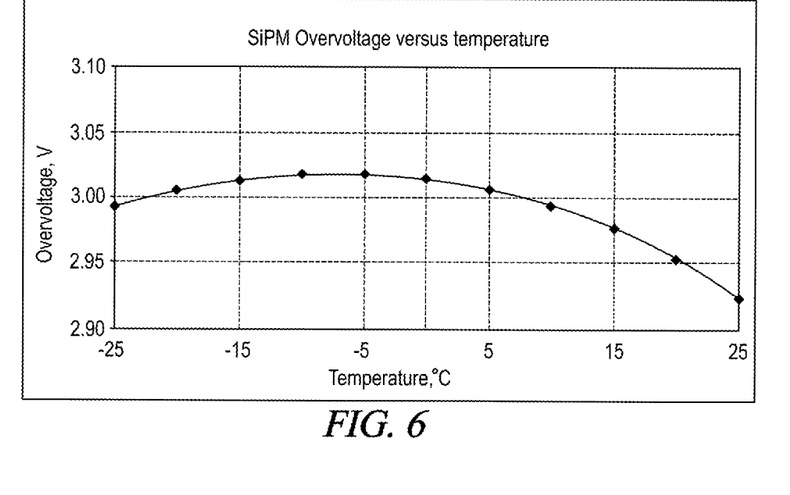
FIG. 6 is a graph showing the SiPM overvoltage (accounting for SiPM leakage current) with respect to temperature.

FIGS. 5 and 6 show modeled results for the device of FIG. 1. The following values were used for the model: Ubr=30 V at 0° C.; Rt=1000 kΩ; TCR=2500 ppm/° C.; TCU_br=1250 ppm/° C.; R1ext=985 kΩ; Rgnd=51 kΩ; and Ups=64V. The values for R1ext and Rgnd were adjusted to obtain an SiPM overvoltage value of 3 V. FIG. 5 shows a graph of the SiPM leakage current with respect to temperature at a constant gain for the following parameters measured at 25° C.: Gain=1.2*10$^6$; and Dark counts rate=1 MHz. FIG. 6 shows a graph of the SiPM overvoltage with respect to temperature and accounting for the SiPM leakage current. As shown in FIG. 6, the overvoltage value can be kept within about 0.8% over the temperature range from about −25° C. to about +10° C.

In some embodiments, the SiPM chips 106 can operate at low light intensities and be cooled down in order to reduce noise level. The operation of the SiPM chip 106 under such conditions can consequently reduce leakage current.

Figure 7A:
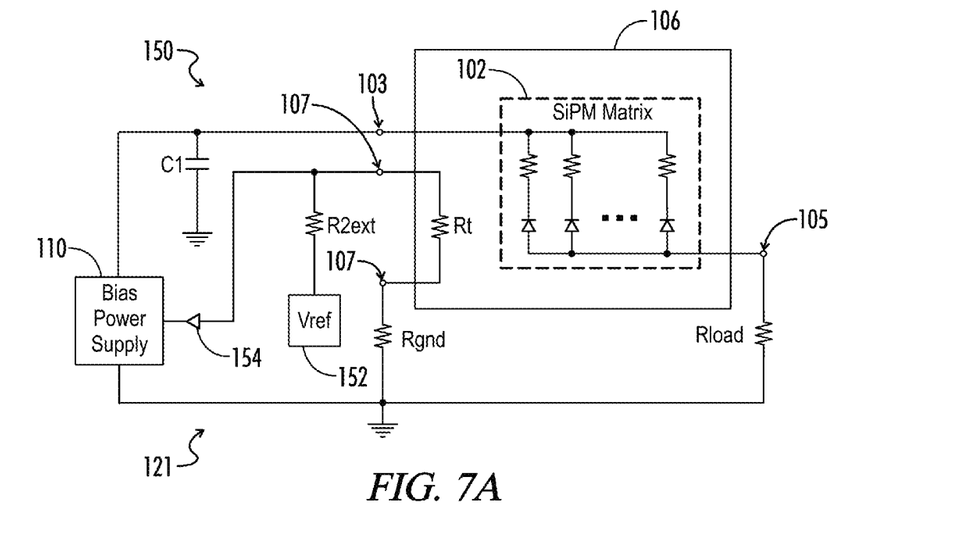
FIGS. 7A and 7B are circuit diagrams of other embodiments of a device with a SiPM.
Figure 7B:
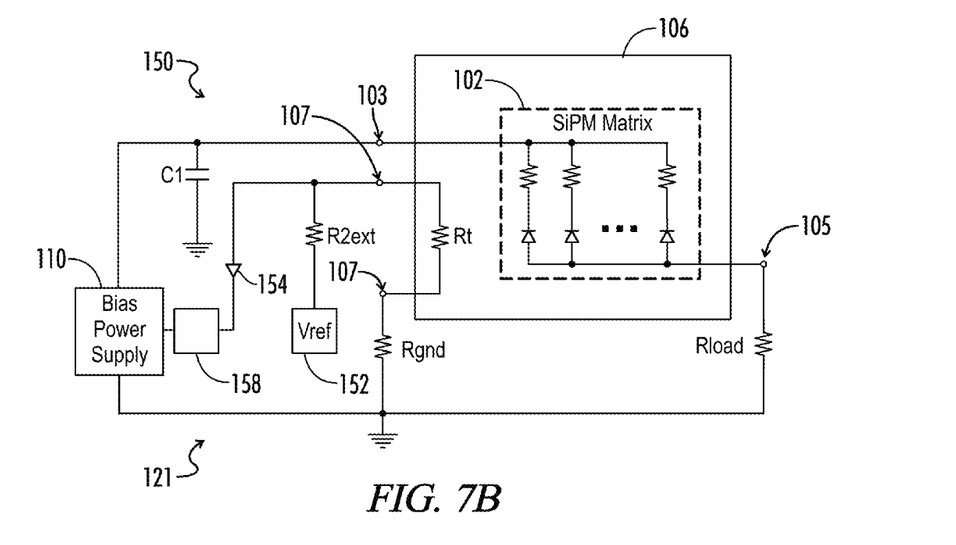

FIGS. 7A and 7B are circuit diagrams of other embodiments of a device 150 with a SiPM. The device 150 shown in FIG. 7A is similar to the device 100 of FIG. 1 except for the use of compensation circuit 121 instead of compensation circuit 120. The compensation circuit 121 can be used to control the voltage output from the bias power supply 110 that then is provided to the input connection 103 for the SiPM matrix 102. The output voltage of the bias power supply 110 provided to the input connection 103 corresponds to the bias voltage for the SiPM matrix 102.

The compensation circuit 121 can include a reference voltage source (Vref) 152 coupled to a resistor R2ext. The output voltage level of the reference voltage source 152 can be lower than the SiPM bias voltage in order to lower power dissipation. In one embodiment the output voltage level of the reference voltage source 152 can be from about 2 V to about 5 V. The resistor R2ext has a low temperature dependence and can be coupled to a terminal of an on-chip resistor Rt, which has a large temperature dependence, for example, TCR=2500 ppm/° C. The other terminal of the resistor Rt can be coupled to ground directly or via resistor Rgnd. The joint between the resistor R2ext and the resistor Rt can also be connected to an amplifier 154 that provides an input to the bias power supply 110 to control the voltage output of the bias power supply 110. The amplifier 154 can provide the required gain to achieve the required range of adjustments to the output of the bias power supply 110.

The embodiment of the device 150 shown in FIG. 7B is similar to the embodiment of the device 150 shown in FIG. 7A except for the use of a steering circuit 158 between the amplifier 154 and the bias power supply 110. The steering circuit 158 can be used to control the adjustment of the output of the bias power supply 110 based on the signal from the amplifier 154. In one embodiment, the steering circuit 158 can include transistors and resistors, but in other embodiments additional and/or different components can be used. In the embodiment shown in FIG. 7B the steering circuit 158 is shown as a separate circuit, but the steering circuit 158 can be incorporated into the bias power supply 110 in other embodiments.

The compensation circuits 121 shown in FIGS. 7A and 7B can be used for applications with large SiPM matrix leakage current and large light intensities. The resistors R2ext and Rgnd in compensation circuit 121 can be adjusted to achieve temperature dependence of the voltage (Ubias control) from the bias power supply 110 (relative to the voltage drop over Rt+Rgnd) similar to the temperature dependence of the SiPM breakdown voltage with scaling factor Ubias/Vref.

In one embodiment, the reference voltage source 152, the amplifier 154 and the steering circuit 158 can be fabricated on the same substrate which holds the SiPM matrix 102 and the resistor Rt. In another embodiment, the resistor R2ext can also be fabricated on the same substrate with the reference voltage source 152, the amplifier 154, the steering circuit 158, the SiPM matrix 102 and the resistor Rt.

Figure 8:
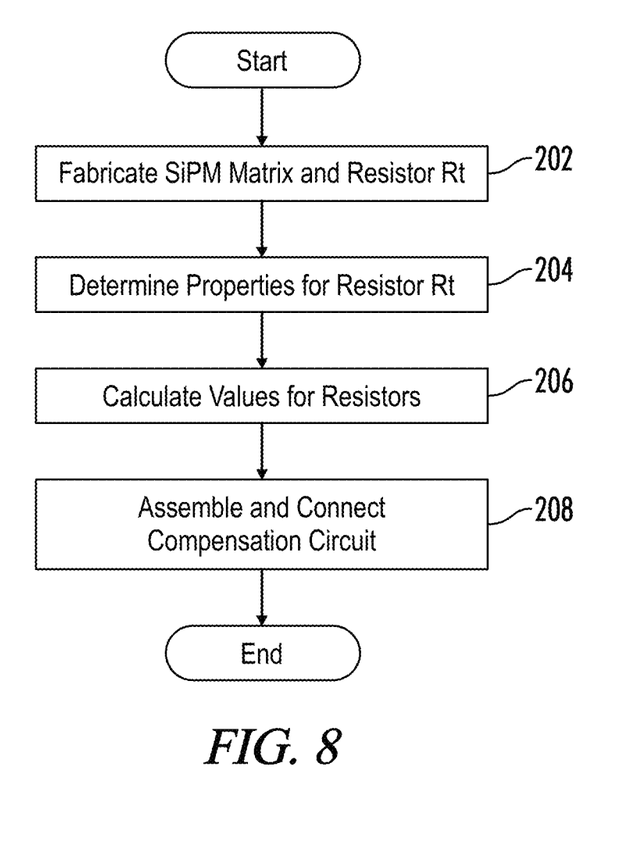
FIG. 8 is a process diagram showing an embodiment for implementing a compensation circuit for a SiPM device.

FIG. 8 shows an embodiment of a process for implementing a compensation circuit 120, 121 for a SiPM device. The process begins by fabricating a silicon chip with the SiPM matrix 102 and the resistor Rt (step 202) on the chip and characterizing the temperature dependence of the SiPM matrix 102. As discussed above, other components such as the steering circuit 158, the amplifier 154 and the reference voltage source 152, if implementing the embodiment of FIG. 7B, may also be fabricated on the silicon chip. Once the silicon chip has been fabricated, the properties for resistor Rt can be determined (step 204). In one embodiment, the resistance of resistor Rt can be measured within the required range of temperatures. After the properties of the resistor Rt are determined, the values for the other resistors of the compensation circuit 120, 121 can be determined (step 206) to obtain a predetermined overvoltage value for the SiPM matrix 102 over the required temperature range.

To define values of R2ext and Rgnd from compensation circuit 121, two temperature dependence characteristics can be created. One characteristic includes the dependence of the SiPM breakdown voltage with respect to temperature. The second characteristic relates to the changing of the bias voltage at the terminal 103 with respect to temperature.

The second characteristic includes the measured characteristic of the resistor Rt over the temperature range, the ratio of the resistive divider formed by resistors R2ext, Rt and Rgnd, the gain of the amplifier 154 and, if used, the steering factor adjustment to the bias power supply 110 provided by the steering circuit 158. Resistors R2ext and Rgnd can be varied until the difference between the two characteristics is minimal over the required temperature range. The overvoltage value can be set by the bias power supply 110. For serial production, the temperature dependence characteristics of Rt and SiPM breakdown voltage can vary insignificantly such that the requirement of measuring the characteristics for each chip over the whole temperature range can be eliminated. The Rt value can be measured at one temperature—for example at 25° C. —and corresponding values of R2ext and Rgnd can be calculated proportionally with the ratio of the value of the resistor Rt measured at 25° C. of the device tested over the whole range of temperatures and the value of the resistor Rt measured at 25° C. of the current serially produced device.

In one embodiment, values for Rgnd and R1ext can be determined if the compensation circuit 120 shown in FIG. 1 is being implemented. In another embodiment, values for Rgnd and R2ext can be determined if the compensation circuit 121 shown in FIGS. 7A and 7B is being implemented. Using the determined resistance values, the corresponding compensation circuit 120, 121 can be assembled and connected to the bias power supply 110 to control the bias voltage applied to the SiPM matrix 102.

In one embodiment, when resistor Rt is configured as an N-well resistor there can be a significant dependence on the voltage applied over Rt (e.g., 8000 ppm/V) that can result in a cumulative increase in temperature dependence (e.g., 600 ppm/° C.) for resistor Rt when Ubr=30V and resistor Rt has a TCR=2500 ppm/° C.). The voltage dependence of resistor Rt does not change the overall performance of the temperature compensation for the SiPM chip, but external resistors in the compensation circuit 120, 121 may have to be adjusted appropriately. Power deposited on resistor Rt can equal 0.9 mW in one embodiment.

It should be understood that the identified embodiments are offered by way of example only. Other substitutions, modifications, changes and omissions may be made in the design, operating conditions and arrangement of the embodiments without departing from the scope of the present application. Accordingly, the present application is not limited to a particular embodiment, but extends to various modifications that nevertheless fall within the scope of the application. It should also be understood that the phraseology and terminology employed herein is for the purpose of description only and should not be regarded as limiting.

What is claimed is:

1. A silicon photomultiplier (SiPM) device comprising:
   a substrate;
   a SiPM matrix fabricated on the substrate; and
   a resistor fabricated on the substrate separate from the SiPM matrix, the resistor having a predetermined temperature dependence greater than a temperature dependence of a breakdown voltage of the SiPM matrix, wherein the predetermined temperature dependence is in the range of about 1500 ppm per degree C. to about 20000 ppm per degree C., and wherein the resistor is configured to sense the temperature of the SiPM matrix in order to compensate for changes in temperature at the SiPM matrix.

2. The SiPM device of claim 1, further comprising a compensation circuit configured to adjust a bias voltage applied to the SiPM matrix in response to temperature changes sensed by the resistor to provide a predetermined overvoltage to the SiPM matrix.

3. A silicon photomultiplier (SiPM) device comprising:
   a substrate;
   a SiPM matrix fabricated on the substrate;
   a resistor fabricated on the substrate with the SiPM matrix, the resistor having a predetermined temperature dependence greater than a temperature dependence of a breakdown voltage of the SiPM matrix, wherein the predetermined temperature dependence is in the range of about 1500 ppm per degree C. to about 20000 ppm per degree C.; and
   a compensation circuit configured to adjust a bias voltage applied to the SiPM matrix in response to temperature changes at the substrate to provide a predetermined overvoltage to the SiPM matrix, wherein the compensation circuit comprises an amplifier, steering circuit and reference voltage source, the steering circuit and reference voltage source fabricated on the substrate with the SiPM matrix and resistor.

4. A silicon photomultiplier (SiPM) device comprising:
   a substrate;

a SiPM matrix fabricated on the substrate; and a resistor fabricated on the substrate with the SiPM matrix, the resistor having a predetermined temperature dependence greater than a temperature dependence of a breakdown voltage of the SiPM matrix, wherein the predetermined temperature dependence is in the range of about 1500 ppm per degree C. to about 20000 ppm per degree C., and wherein the resistor is positioned on a perimeter of the substrate and substantially surrounds the SiPM matrix.

5. A silicon photomultiplier (SiPM) device comprising:
a substrate;
a SiPM matrix fabricated on the substrate;
a bias power supply connected to the SiPM matrix, the bias power supply configured to provide a bias voltage to the SiPM matrix; and
a compensation circuit coupled to the bias power supply, the compensation circuit configured to adjust the bias voltage applied to the SiPM matrix in response to temperature changes at the substrate, the compensation circuit comprising a resistor fabricated on the substrate separate from the SiPM matrix, the resistor being configured to have a resistance that varies in response to temperature changes at the substrate, and wherein adjustments of the bias voltage by the compensation circuit are based on changes in the resistance of the resistor.

6. The SiPM device of claim 5, wherein the compensation circuit is configured to adjust the bias voltage applied to the SiPM matrix to provide a predetermined overvoltage to the SiPM matrix.

7. The SiPM device of claim 5, wherein the resistor has a temperature coefficient of resistance that is greater than a temperature dependence of the SiPM matrix breakdown voltage by a factor of about 1.5 to about 10.

8. The SiPM device of claim 5, wherein the resistor comprises one of an N-well or P-well type CMOS resistor.

9. A silicon photomultiplier (SiPM) device comprising:
a substrate;
a SiPM matrix fabricated on the substrate;
a bias power supply connected to the SiPM matrix, the bias power supply configured to provide a bias voltage to the SiPM matrix; and
a compensation circuit coupled to the bias power supply, the compensation circuit configured to adjust the bias voltage applied to the SiPM matrix in response to temperature changes at the substrate, the compensation circuit comprising a resistor fabricated on the substrate with the SiPM matrix, the resistor being configured to have a resistance that varies in response to temperature changes at the substrate, and wherein the resistor is positioned on a perimeter of the substrate.

10. A silicon photomultiplier (SiPM) device comprising:
a substrate;
a SiPM matrix fabricated on the substrate;
a bias power supply connected to the SiPM matrix, the bias power supply configured to provide a bias voltage to the SiPM matrix; and
a compensation circuit coupled to the bias power supply, the compensation circuit configured to adjust the bias voltage applied to the SiPM matrix in response to temperature changes at the substrate, the compensation circuit comprising a resistor fabricated on the substrate with the SiPM matrix, the resistor being configured to have a resistance that varies in response to temperature changes at the substrate, and wherein the resistor substantially surrounds the SiPM matrix.

11. A silicon photomultiplier (SiPM) device comprising:
a substrate;
a SiPM matrix fabricated on the substrate;
a bias power supply connected to the SiPM matrix, the bias power supply configured to provide a bias voltage to the SiPM matrix; and
a compensation circuit coupled to the bias power supply, the compensation circuit configured to adjust the bias voltage applied to the SiPM matrix in response to temperature changes at the substrate, the compensation circuit comprising a resistor fabricated on the substrate with the SiPM matrix, the resistor being configured to have a resistance that varies in response to temperature changes at the substrate, and wherein the resistor is a first resistor and the compensation circuit comprises a second resistor connected between the first resistor and ground.

12. The SiPM device of claim 11, wherein the compensation circuit comprises a third resistor connected between the bias power supply and a cathode of the SiPM matrix.

13. The SiPM device of claim 12, wherein the first resistor is connected to the cathode of the SiPM matrix, the bias power supply is configured to provide a fixed voltage output and the compensation circuit is configured to operate as voltage divider to adjust the fixed output voltage from the bias power supply to the bias voltage provided to the cathode of the SiPM matrix.

14. The SiPM device of claim 11, wherein the compensation circuit comprises a third resistor connected to a voltage reference source and the first resistor.

15. The SiPM device of claim 14, wherein the compensation circuit comprises an amplifier connected to the third resistor, the amplifier configured to provide a control signal to the bias power supply and wherein the bias power supply is configured to provide a bias voltage to the SiPM matrix based on the control signal from the amplifier.

16. A method for operating a silicon photomultiplier (SiPM), the method comprising:
providing a bias voltage to a SiPM matrix with a bias power supply, the SiPM matrix being fabricated on a substrate;
sensing a temperature at the SiPM matrix with a resistor, the resistor fabricated on the substrate separate from the SiPM matrix;
determining a change in the temperature of the SiPM matrix with a compensation circuit, the compensation circuit comprising the resistor and connected to the bias power supply; and
adjusting, with the compensation circuit, the bias voltage provided to the SiPM matrix by the bias power supply in response to a determination that the temperature at the SiPM matrix has changed.

17. The method of claim 16, wherein the resistor has a temperature coefficient of resistance that is greater than a temperature dependence of the SiPM matrix breakdown voltage by a factor of about 1.5 to about 10.

18. The method of claim 16, wherein the adjusting the bias voltage includes adjusting the bias voltage applied to the SiPM matrix to provide a predetermined overvoltage to the SiPM matrix.

19. The method of claim 16, wherein the adjusting the bias voltage includes connecting the compensation circuit between an output of the bias power supply and an input for the SiPM matrix, the compensation circuit configured to adjust the bias voltage based on a change of resistance of the resistor in response to a change in the temperature at the SiPM matrix.

20. The method of claim 16, wherein the adjusting the bias voltage includes providing an input to the bias power supply by the compensation circuit, wherein the bias power supply is configured to adjust the bias voltage provided to the SiPM matrix in response to the input from the compensation circuit.

21. A method for operating a silicon photomultiplier (SiPM), the method comprising:
- providing a bias voltage to a SiPM matrix with a bias power supply;
- measuring a temperature at the SiPM matrix with a resistor, the resistor fabricated on a substrate with the SiPM matrix;
- determining a change in the measured temperature with a compensation circuit, the compensation circuit comprising the resistor and connected to the bias power supply;
- adjusting, with the compensation circuit, the bias voltage provided to the SiPM matrix by the bias power supply in response to a determination that the measured temperature has changed; and
- wherein the resistor is positioned on a perimeter of the substrate.

22. A method for operating a silicon photomultiplier (SiPM), the method comprising:
- providing a bias voltage to a SiPM matrix with a bias power supply;
- measuring a temperature at the SiPM matrix with a resistor, the resistor fabricated on a substrate with the SiPM matrix;
- determining a change in the measured temperature with a compensation circuit, the compensation circuit connected to the bias power supply and comprising a steering circuit and the resistor;
- adjusting, with the compensation circuit, the bias voltage provided to the SiPM matrix by the bias power supply in response to a determination that the measured temperature has changed; and
- fabricating the steering circuit on the substrate with the SiPM matrix and resistor.

* * * * *